United States Patent
McCune, Jr.

(10) Patent No.: US 9,397,621 B2
(45) Date of Patent: Jul. 19, 2016

(54) LIMITING DRIVER FOR SWITCH-MODE POWER AMPLIFIER

(71) Applicant: Eridan Communications, Inc., San Francisco, CA (US)

(72) Inventor: Earl W McCune, Jr., Santa Clara, CA (US)

(73) Assignee: Eridan Communications, Inc., San Francisco, CA (US)

( * ) Notice: Subject to any disclaimer, the term of this patent is extended or adjusted under 35 U.S.C. 154(b) by 0 days.

(21) Appl. No.: 14/447,452

(22) Filed: Jul. 30, 2014

(65) Prior Publication Data

US 2016/0036399 A1 Feb. 4, 2016

(51) Int. Cl.
| | |
|---|---|
| *H03F 3/217* | (2006.01) |
| *H03F 3/193* | (2006.01) |
| *H03F 1/30* | (2006.01) |
| *H03F 1/32* | (2006.01) |
| *H03F 3/45* | (2006.01) |
| *H03F 1/02* | (2006.01) |

(52) U.S. Cl.
CPC ............ *H03F 3/2171* (2013.01); *H03F 1/0283* (2013.01); *H03F 1/301* (2013.01); *H03F 1/3205* (2013.01); *H03F 3/193* (2013.01); *H03F 3/45179* (2013.01); *H03F 3/45183* (2013.01); *H03F 2200/451* (2013.01); *H03F 2203/45112* (2013.01)

(58) Field of Classification Search
None
See application file for complete search history.

(56) References Cited

U.S. PATENT DOCUMENTS

| | | | | |
|---|---|---|---|---|
| 4,296,382 | A * | 10/1981 | Hoover | ............... H03F 1/342 330/264 |
| 2003/0141941 | A1 | 7/2003 | Ozawa et al. | |
| 2004/0239372 | A1 | 12/2004 | Hung et al. | |
| 2005/0200412 | A1* | 9/2005 | Kaizaki | ............... H03F 3/195 330/253 |
| 2008/0116972 | A1* | 5/2008 | McMorrow | ............ H03F 3/217 330/251 |
| 2009/0009243 | A1 | 1/2009 | McCune, Jr. | |
| 2012/0139589 | A1* | 6/2012 | Machida | ............ H03K 17/0822 327/109 |

OTHER PUBLICATIONS

Mahalawy et al, An All-GaN Differential Driver, Jun. 2014.*

(Continued)

*Primary Examiner* — Ping Hsieh
*Assistant Examiner* — James Yang
(74) *Attorney, Agent, or Firm* — Patent Law Professionals, P.C.; William E. Winters (57) ABSTRACT

A switch-mode RFPA driver includes first and second field-effect transistors (FETs) arranged in a totem-pole-like configuration. The switch-mode RFPA driver operates to generate a switch-mode RFPA drive signal having a generally square-wave-like waveform from an input RF signal having a generally sinusoidal-like waveform. To maximize high-frequency operation and avoid distorting the switch-mode RFPA drive signal, the switch-mode RFPA driver is designed so that its output can be connected directly to the input of the switch-mode RFPA to be driven, i.e., without using or requiring the use of an AC coupling capacitor. The first and second FETs of the switch-mode RFPA driver are designed and configured to limit and control the upper and lower magnitude levels of the switch-mode RFPA drive signal to levels suitable for switching the switch-mode RFPA directly, obviating any need for DC biasing at the input of the switch-mode RFPA.

14 Claims, 4 Drawing Sheets

(56) References Cited

OTHER PUBLICATIONS

International Search Report (ISR) and Written Opinion from PCT Patent Appl. No. PCT/US2015/036725.

M.E. Mahalawy et al., An All-GaN Differential Driver for a 60 V GaN-Based Power Amplifier with 1 GHz Switching Frequency, IEEE 15th Annual Wireless and Microwave Technology Conference (WAMICON), 2014.

* cited by examiner

LIMITING DRIVER FOR SWITCH-MODE POWER AMPLIFIER

FIELD OF THE INVENTION

The present invention relates to radio frequency power amplifiers (RFPAs). More specifically, the present invention relates to methods and apparatus for driving switch-mode RFPAs.

BACKGROUND OF THE INVENTION

Radio frequency (RF) transmitters are used to transmit RF signals over the air (or some other transmission medium, such as coaxial cable or other waveguide) to an RF receiver. To compensate for attenuation of the RF signals as they propagate to the receiver, the RF signals are amplified by a radio frequency power amplifier (RFPA), prior to being transmitted.

Various emerging and future military and commercial applications require or will require RFPAs capable of producing very high RF output powers, for example, tens to hundreds of watts, at microwave frequencies. Over the years, a substantial amount of research has been dedicated to identifying semiconducting materials that can be used to build RFPAs that satisfy this dual requirement of high-power and high-frequency. One of the most promising semiconducting materials that has been identified is gallium nitride (GaN). GaN is a group III/V semiconductor having a very wide bandgap (~3.4 eV @ 300K) and a very high breakdown field (300 V/μm @ 300K). These two attributes are highly desirable since they afford the ability to manufacture GaN-based transistors with high breakdown voltages—a necessary requirement for realizing high RF output powers at good efficiency. GaN also has a high thermal conductivity (~2.3 W/cm·K @ 300K), which further facilitates high power operation.

Figure 1:
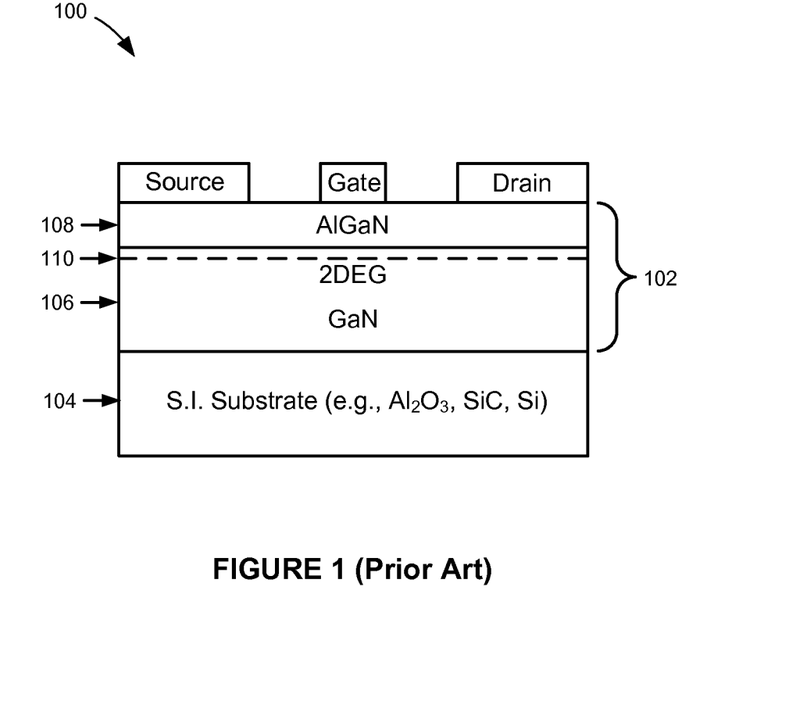
FIG. 1 is a simplified cross-sectional drawing of a typical GaN-HEMT, highlighting the GaN-HEMT's salient material layers and physical characteristics.

In order for semiconductor-based RFPAs to be capable of operating at microwave frequencies, the semiconducting material should also have a high carrier mobility. GaN in its bulk form has a moderate carrier mobility similar to that observed in silicon. However, the electron mobility can be substantially increased when GaN is used in a high electron-mobility transistor (HEMT) device topology. FIG. 1 is a simplified cross-sectional drawing of a typical GaN-HEMT 100, highlighting the GaN-HEMT's salient material layers and physical characteristics. The GaN-HEMT 100 includes an AlGaN/GaN heterostructure 102 formed on an electrically-insulating or semi-electrically-insulating substrate 104 (e.g., silicon-carbide (SiC), sapphire ($Al_2O_3$) or silicon (Si)). The different bandgaps of AlGaN and GaN result in formation of a quantum well in the lower-bandgap GaN 106 material, near the AlGaN/GaN interface. When the AlGaN/GaN heterostructure 102 is formed, charge carriers (i.e., electrons) from the wider bandgap AlGaN layer 108 diffuse into the quantum well in the lower bandgap GaN layer 106, thereby forming a highly-concentrated two-dimensional electron gas (2 DEG) 110. Confining the electrons to the 2 DEG 110 has the effect of substantially increasing the GaN electron mobility compared to what is observed in bulk GaN, making the GaN-based HEMT 100 suitable for high-frequency operation.

The high-power, high-frequency capability of the GaN-based HEMT has made it a desirable candidate for building RFPAs that are capable of operating at high frequencies and high RF output powers. In recent years, RFPAs utilizing GaN-based HEMTs have been successfully manufactured, validating this capability. However, methods and apparatus for efficiently driving GaN-HEMT-based RFPAs in wideband, high power applications are lacking and greatly needed.

BRIEF SUMMARY OF THE INVENTION

Methods and apparatus for driving switch-mode radio frequency power amplifiers (RFPAs) are disclosed. An exemplary switch-mode RFPA driver includes first and second field-effect transistors (FETs) arranged in a totem-pole-like configuration. The switch-mode RFPA driver operates to generate a switch-mode RFPA drive signal having a generally square-wave-like waveform from an input RF signal having a generally sinusoidal-like waveform. According to one embodiment of the invention, to maximize high-frequency operation and avoid distorting the switch-mode RFPA drive signal, the switch-mode RFPA driver is designed so that its output can be connected directly to the input of the switch-mode RFPA to be driven, i.e., without using or requiring the use of an AC coupling capacitor. The first and second FETs of the switch-mode RFPA driver are designed and configured to limit and control the upper and lower magnitude levels of the switch-mode RFPA drive signal to levels suitable for switching the switch-mode RFPA directly, obviating any need for DC biasing at the input of the switch-mode RFPA.

In one embodiment of the invention, the RFPA driver is configured to be controlled by an unbalanced differential driver control circuit, which, operating according to an input RF signal, generates first and second gate control signals for controlling the gates of the first and second FETs of the totem pole switch-mode RFPA driver. An optional signal conditioning circuit may also first be employed (i.e., before the differential driver control circuit generates the first and second gate control signals) to reduce the low-to-high and high-to-low transition times of the input RF signal and support the production of a switch-mode RFPA drive signal having a square-wave-like waveform.

The RFPA driver apparatus of the present invention is capable of operating at high frequencies and high RF output powers, making it particularly useful for high-power, high-frequency applications, such as military radar and commercial base station systems, for example. In one embodiment of the invention, the RFPA driver apparatus and associated switch-mode RFPA are both integrated in a single gallium nitride based (GaN-based) monolithic microwave integrated circuit (MMIC), with the transistors of the RFPA driver apparatus and switch-mode RFPA all being gallium nitride high electron-mobility transistors (GaN-HEMTs). Because GaN has a high thermal conductivity and the GaN-based MMIC can be formed on a high-thermal-conductivity substrate (e.g., silicon carbide or diamond), heat generated by the RFPA can be readily conducted away from the active regions of the RFPA driver apparatus and RFPA, thereby protecting the RFPA driver apparatus and RFPA from being damaged or destroyed due to excessive heat. The ability to effectively conduct heat away from the RFPA and RFPA driver apparatus also reduces the size and cost of any external cooling system that may be needed. Finally, because the RFPA is a switch-mode RFPA, the single GaN-based MMIC can be advantageously used in battery-operated devices in which battery life is a major concern, such as in handheld and military backpack radios, for example.

Further features and advantages of the invention, including a detailed description of the above-summarized and other exemplary embodiments of the invention, will now be described in detail with respect to the accompanying draw-

DETAILED DESCRIPTION

Figure 2:
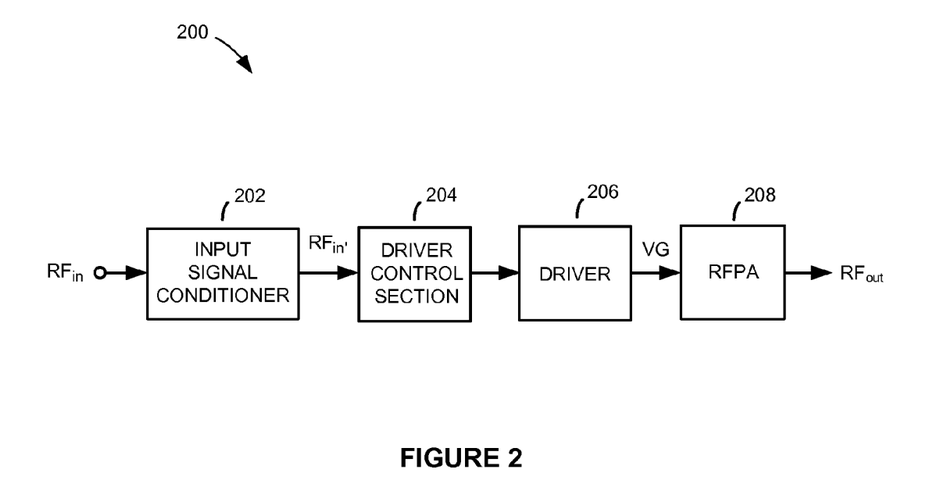
FIG. 2 is a block level drawing of a radio frequency power amplifier (RFPA) driver apparatus, according to an embodiment of the present invention.

Referring to FIG. 2, there is shown a block diagram of an exemplary radio frequency power amplifier (RFPA) driver apparatus 200, according to an embodiment of the present invention. The RFPA driver apparatus 200 comprises an input signal conditioner 202, a driver control section 204, and a driver 206, which is configured to drive a switch-mode RFPA 208. As explained in the detailed description that follows, the input signal conditioner 202 operates to transform an RF input signal $RF_{in}$ having a generally sinusoidal-like waveform into a conditioned RF input signal $RF_{in}'$ having faster edge transitions and a generally square-wave-like waveform; the driver control section 204 controls operation of the driver 206, in accordance with the conditioned RF input signal $RF_{in}'$; and the driver 206 generates a drive signal VG having a generally square-wave like waveform and limited low and high magnitude levels suitable for driving the switch-mode RFPA 208.

Figure 3:
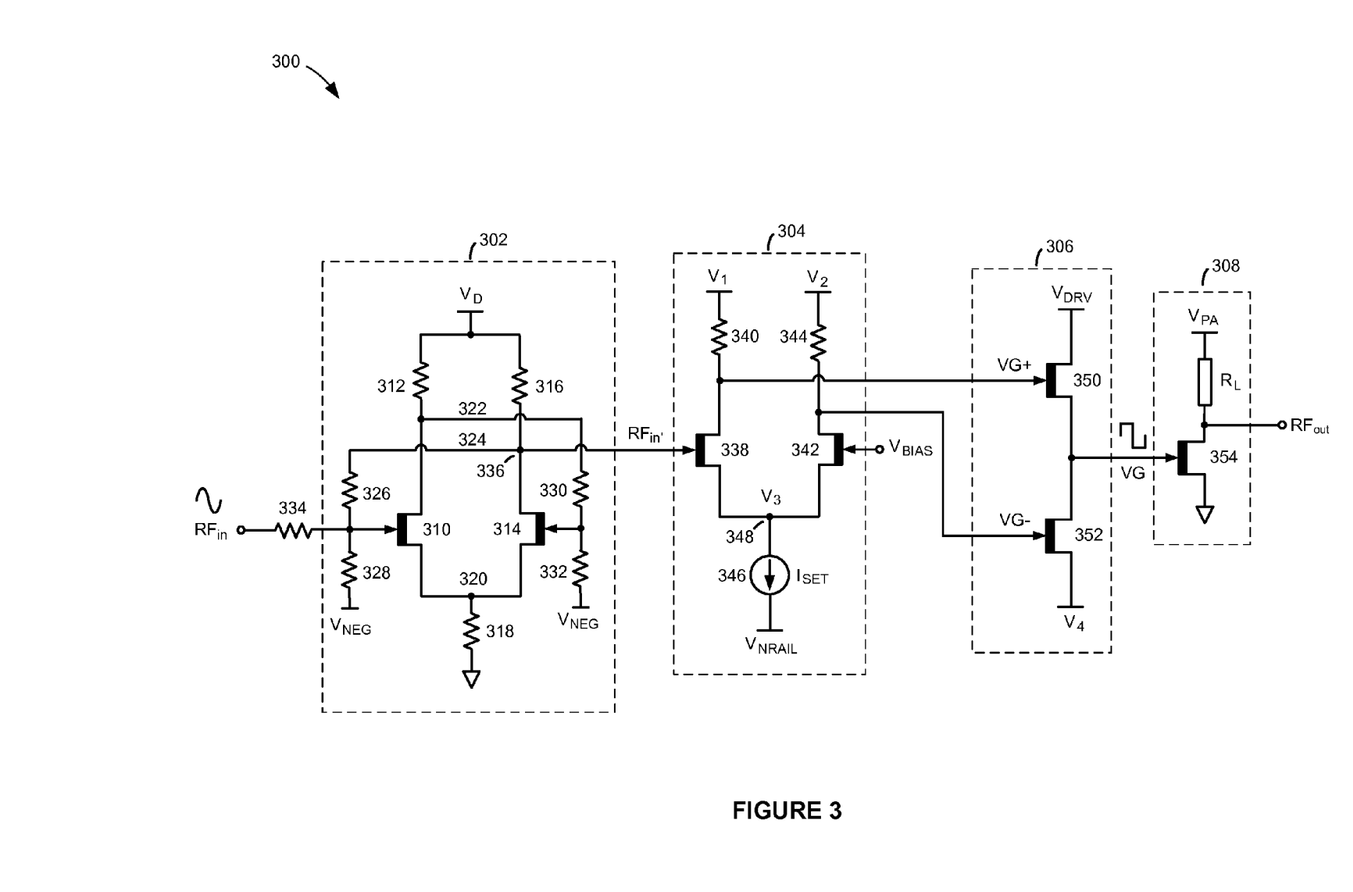
FIG. 3 is a schematic diagram of an RFPA driver apparatus, according to an embodiment of the present invention.

FIG. 3 is a schematic diagram of an exemplary RFPA driver apparatus 300 designed in accordance with the general block-level representation of the RFPA driver apparatus 200 in FIG. 2. The RFPA driver apparatus 300 comprises an input signal conditioning circuit 302, a driver control circuit 304, and a driver circuit 306, which is configured to drive a main power switch 354 of a switch-mode RFPA 308. In one embodiment of the invention the RFPA driver apparatus 300 and switch-mode RFPA 308 are both formed in a single gallium-nitride-based (GaN-based) monolithic microwave integrated circuit (MMIC), with all transistors being depletion-mode, n-channel AlGaN/GaN high electron-mobility transistors (referred to simply as "GaN-HEMTs" in the description that follows). By utilizing GaN-HEMTs the RFPA driver apparatus 300 and switch-mode RFPA 308 are able to operate at high frequencies (e.g. several GHz and above). Further, because GaN has a wide bandgap (~3.4 eV @ 300K), high breakdown field (300 V/μm @ 300K), and high thermal conductivity (~2.3 W/cm·K @ 300K), utilizing GaN-based HEMTs in the RFPA driver apparatus 300 allows the switch-mode RFPA 308 to generate very high RF output powers (tens to hundreds of watts) at high power densities (e.g., >5 W/mm). To further facilitate high-power operation the GaN-based RFPA driver apparatus 300/switch-mode RFPA 308 GaN-based MMIC can be manufactured on a high-thermal-conductivity heat-sinking substrate, such as SiC or diamond. The high-thermal-conductivity property of GaN and the heat-sinking substrate allow heat to be readily conducted away from the RFPA 308 and RFPA driver apparatus 300, thereby protecting the RFPA 308 and RFPA driver apparatus 300 from being damaged or destroyed due to excessive heating. The ability to effectively conduct heat away from the RFPA 308 and RFPA driver apparatus 300 also reduces the size and cost of any external cooling system that may be needed.

In embodiments of the invention in which the RFPA driver apparatus 300 is implemented as a GaN-based MMIC using GaN-HEMTs, it and the GaN-HEMTs may be fabricated using metal-organic chemical vapor deposition (MOCVD), molecular beam epitaxy (MBE), or any other suitable manufacturing process. Details of some exemplary MOCVD fabrication processes that may be used or adapted to fabricate the GaN-based RFPA driver apparatus 300 and RFPA 308 may be found in, for example, U.S. Pat. No. 7,230,284 to Parikh et al., U.S. Pat. No. 7,364,988 to Harris et al., and Pengelly et al., *A Review of GaN on SiC High Electron-Mobility Power Transistors and MMICs*, IEEE Transactions on Microwave Theory and Techniques, vol. 60, no. 6, June 2012, all of which are incorporated herein by reference.

In the description of the exemplary embodiments of invention that follows, it is assumed that all transistors in the various circuits of the RFPA driver apparatus 300 and the RFPA 308 are GaN-based HEMTs. It should be emphasized, however, that the invention is not limited to GaN-based-HEMT technology or to developing drive signals for GaN-based RFPAs. In other words, although the RFPA driver apparatus 300 and RFPA 308 are preferably made from GaN-based HEMTs, other types of depletion-mode field effect devices, possibly made from other semiconducting materials, could be alternatively used. Also, although it is preferred that the circuitry of the RFPA driver apparatus 300 (input signal conditioning circuit 302, driver control circuit 304, and driver circuit 306) and RFPA 308 all be formed in a single MMIC, the RFPA driver apparatus 300 and RFPA 308 could be formed separately, for example, with the RFPA driver apparatus 300 implemented in a first MMIC, the RFPA 308 implemented in a second MMIC, and both MMICs mounted and configured in a hybrid RF power module. In an implementation in which the RFPA driver apparatus 300 is implemented separate from the RFPA 308 (i.e., both not formed in the same MMIC), the RFPA 308 could then be implemented, though not necessarily, using a different field-effect transistor topology than used to implement the RFPA driver apparatus 300 (i.e., using a transistor topology other than a HEMT), and/or could be made from a different type of semiconducting material than that used to form the RFPA driver apparatus 300 (i.e., a semiconductor other than GaN).

A detailed description of the various circuits making up the RFPA driver apparatus 300 will now be presented, starting with a detailed description of the input signal conditioning circuit 302. As shown in FIG. 3, the input signal conditioning circuit 302 comprises a balanced differential pair having: a first arm including a first GaN-HEMT 310 connected in series with a first load resistor 312; a second arm including a second GaN-HEMT 314 connected in series with a second load resistor 316; and a tail resistor 318. The first and second load resistors 312 and 316 are coupled between a common power supply $V_D$ and the drains of their respective GaN-HEMTs 310 and 314. The sources of the first and second GaN-HEMTs 310 and 314 are connected together at a common node 320 (also referred to as the "common source node 320" below). The tail resistor 318 is connected between the common source node 320 and ground or to some other negative voltage source. The first and second GaN-HEMTs 310 and 314 are substantially identical, both being depletion-mode, n-channel GaN-HEMTs and both having a common negative pinch-off voltage $V_P$. In fact, all GaN-HEMTs in the exemplary RFPA driver apparatus 300 described here (i.e., not just the first and second GaN-HEMTs 310 and 314 have the same (i.e., common) pinch-off voltage $V_P$. (In one specific embodiment of the invention, for example, all GaN-HEMTs in the RFPA driver apparatus 300, as well as the main power switch (GaN-HEMT 354) of the switch-mode RFPA 308, have a common pinch-off voltage $V_P$=−3.8V.) It should be emphasized, however, that a common pinch-off voltage $V_P$ is not an absolute requirement, insofar as the claimed invention is concerned.

The gates of the first and second GaN-HEMTs 310 and 314 are biased to DC bias voltages determined by the voltage dividers formed by bias resistors 326, 328, 330 and 332, the power supply voltage $V_D$, and the negative bias voltage $V_{NEG}$. In one embodiment of the invention the bias resistors 326, 328, 330 and 332 have values that set the gate bias voltage at both gates of the first and second GaN-HEMTs 310 and 314 to a value close to zero volts. Setting the gate bias voltages to zero volts allows the RF input signal $RF_{in}$ to be directly coupled to the input signal conditioning circuit, via RF coupling resistor 334. The resistance of the tail resistor 318 is selected so that the DC gate-to-source voltage of both the first and second GaN-HEMT 310 and 314 is greater than the pinch-off voltage $V_P$ but not so high that any input Schottky diodes which may be present at the gates of the first and second GaN-HEMTs 310 and 314 are able to clamp the RF input signal $RF_{in}$.

The principal function of the input signal conditioning circuit 302 is to transform the generally sinusoidal-like RF input signal $RF_{in}$ into a conditioned RF signal $RF_{in}'$ having faster low-to-high and high-to-low transitions. Depending on the application, the RF input signal $RF_{in}$ may be modulated or unmodulated. (For example, in an application in which the RFPA driver apparatus 300 and RFPA 308 are employed in a polar modulation transmitter, the RF input signal $RF_{in}$ could be an angle-modulated RF carrier signal.) The input signal conditioning circuit 302 reduces the high-to-low and low-to-high transition times of the RF input signal $RF_{in}$ by exploiting a first feedback path 322 formed from the drain of the first GaN-HEMT 310 to the gate of the second GaN HEMT 314, and a second feedback path 324 formed from the drain of the second GaN-HEMT 314 to the gate of the first GaN-HEMT 310. When the RF input signal $RF_{in}$ is applied to the input signal conditioning circuit 302 and begins swinging negative below the bias point (bias point is assumed to be zero volts in the description that follows), the resistance of the first GaN-HEMT 310 increases, causing the drain voltage of the first GaN-HEMT 310 to be pulled up toward the supply voltage $V_D$. The increasing drain voltage is fed to the gate of the second GaN-HEMT 314, via the first feedback path 322, thereby reinforcing the gate drive of the second GaN-HEMT 314. As the drain voltage of the first GaN-HEMT 310 increases, the drain voltage of the second GaN-HEMT 314 decreases. The decreasing drain voltage is fed to the gate of the first GaN-HEMT 310, via the second feedback path 324, reducing the gate drive of the first GaN-HEMT 310. Reducing the gate drive of the first GaN-HEMT 310 while reinforcing the gate drive of the second GaN-HEMT 314 in this manner has the effect of accelerating the transition of the signal produced at the output node 336 (referred to as the conditioned RF input signal $RF_{in}'$ below) from high to low (i.e., compared to if no gate drive reduction and reinforcement were applied). The result is a conditioned RF input signal $RF_{in}'$ having faster high-to-low transitions than the unconditioned RF input signal $RF_{in}$. On the other hand, for transitions from low to high, when the RF input signal $RF_{in}$ begins swinging positive, the resistance of the second GaN-HEMT 314 increases, causing the drain voltage of the second GaN-HEMT 314 to be pulled up toward the supply voltage $V_D$. The increasing drain voltage is fed to the gate of the first GaN-HEMT 310, via the second feedback path 324 to reinforce the gate drive of the first GaN-HEMT 310. As the drain voltage of the second GaN-HEMT 314 increases, the drain voltage of the first GaN-HEMT 310 decreases. The decreasing drain voltage is fed to the gate of the second GaN-HEMT 314, via the first feedback path 322, thereby reducing the gate drive of the second GaN-HEMT 314. Reducing the gate drive of the second GaN-HEMT 314 while reinforcing the gate drive of the first GaN-HEMT 310 in this manner has the effect of accelerating the low-to-high transition of the conditioned RF input signal $RF_{in}'$ (i.e., compared to if no gate drive reduction and reinforcement were applied), resulting in a conditioned RF input signal $RF_{in}'$ having faster low-to-high transitions than the unconditioned RF input signal $RF_{in}$.

The conditioned RF input signal $RF_{in}'$ produced at the output node 336 of the input signal conditioning circuit 302 is applied to the input of the driver control circuit 304. (Note that in the exemplary RFPA driver apparatus 300 depicted in FIG. 3, the driver control circuit 304 is driven single-endedly. In other embodiments of the invention it is driven differentially using the RF drain outputs of the first and second GaN HEMTs 310 and 314 as the differential drive signals.) The driver control circuit 304 comprises an unbalanced differential pair having: a first arm including a first GaN-HEMT 338 connected in series with a first load resistor 340; a second arm including a second GaN-HEMT 342 connected in series with a second load resistor 344; and a tail current source 346. A supply end of the first load resistor 340 in the first arm is connected to a first power supply producing a voltage $V_1$ (which in one embodiment of the invention is the same voltage $V_{DRV}$ applied to the driver circuit 306, i.e., $V_1 = V_{DRV}$), and the supply end of the second resistor 344 in the second arm is connected to a second power supply voltage $V_2$ (which in one embodiment of the invention is the same as the voltage $V_4$ applied to the source of the driver transistor 352 in the driver circuit 308, i.e., $V_2 = V_4$). The gates of the first and second GaN-HEMTs 338 and 342 are both biased to a gate bias voltage $V_{BIAS}$ having a value higher than the pinch-off voltage $V_P$ but not so high that any Schottky diodes which may be present at the gates of the first and second GaN-HEMTs 338 and 348 are able to clamp the conditioned RF input signal $RF_{in}'$. Biasing the gates of the first and second GaN-HEMTs 338 and 342 above pinch-off, i.e., $V_{BIAS} > V_3 + V_P$, also ensures that a current path is always available for the tail current source 346.

Figure 4:
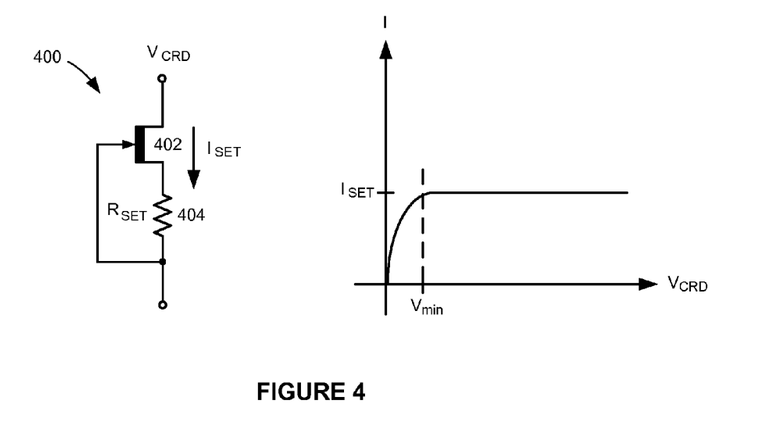
FIG. 4 is a schematic drawing of a current-regulating diode, which can be used to implement the current source in the driver control circuit of the RFPA driver apparatus in FIG. 3.

The tail current source 346 is connected between the common source node 348 and a negative power supply voltage $V_{NRAIL}$. In one embodiment of the invention, the tail current source 346 is implemented using a current-regulating (CR) diode 400. As illustrated in FIG. 4, the CR diode 400 comprises a GaN-HEMT 402 and a current-setting resistor 404 connected between the source and gate of the GaN-HEMT 402. The CR diode 400 produces a constant current $I_{SET}$ of a value determined by the resistance of the current-setting resistor 404. The voltage dropped by the current-setting resistor 404 ($I_{SET} \times R_{SET}$) is fed back across the gate-source terminals of the GaN-HEMT 402. The fed-back voltage is negative from gate to source (i.e., $V_{GS} = -(I_{SET} \times R_{SET})$). Accordingly, any propensity of the CR diode current to deviate from $I_{SET}$ is opposed by the negative feedback. For example, if the supply voltage $V_{CRD}$ was to increase in an attempt to increase the drain current through the GaN-HEMT 402, the voltage drop across the current-setting resistor 404 would increase and since the fed-back voltage is negatively applied across the gate-source terminals of the GaN-HEMT 402 the GaN-HEMT 402 would oppose the increase in current, forcing the drain current back down to $I_{SET}$. So long as the supply voltage $V_{CRD}$ is not reduced below a minimum voltage $V_{min}$, the CR diode 400 is effective at regulating the constant current $I_{SET}$ in this manner, despite any variation in the supply voltage $V_{CRD}$.

Figure 5A:
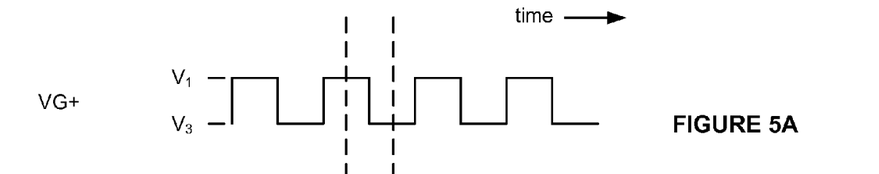
FIGS. 5A and 5B are signal diagrams of first and second driver control signals generated by the driver control circuit of the RFPA driver apparatus in FIG. 3.
Figure 5B:
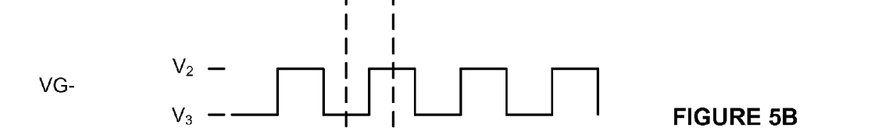

The primary purpose of the driver control circuit 304 is to generate first and second gate control signals VG+ and VG− for controlling operation of the driver circuit 306. When the conditioned RF input signal $RF_{in}'$ increases higher than the gate bias voltage $V_{BIAS}$, the resistance of the first GaN-HEMT 338 decreases, eventually to a value that is negligible compared to the resistance of the first load resistor 340. This results in the drain voltage VG+ of the first GaN-HEMT 338 being pulled down to the DC voltage $V_3$ at the common source node 348. (In one embodiment of the invention $V_3=-8V$.) The first and second GaN-HEMT 338 and 342 operate as source followers. Accordingly, as the drain voltage VG+ of the first GaN-HEMT 338 is being pulled down to voltage $V_3$, the voltage at the source of the second GaN-HEMT 342 rises, effectively lowering the gate-to-source voltage applied to the second GaN-HEMT 342 and causing the second GaN-HEMT 342 to turn OFF. With the second GaN-HEMT 342 turned OFF, the drain voltage VG− of the second GaN-HEMT 342 is pulled up to the supply voltage $V_2$. ($V_2=-4V$ in one embodiment of the invention.) Subsequently, when the conditioned RF input signal $RF_{in}'$ transitions to a value below the bias voltage $V_{BIAS}$, the resistance of the first GaN-HEMT 338 increases, resulting in the drain voltage VG+ of the first GaN-HEMT 238 being pulled up to the supply voltage $V_1$. (In one embodiment of the invention, $V_1=V_{DRV}$ and $-2 \leq V_{DRV} \leq 0V$.) Since the first and second GaN-HEMTs 338 and 342 also operate as source followers, as the drain voltage VG+ of the first GaN-HEMT 338 is being pulled up to the supply voltage $V_1$, the voltage at the source of the second GaN-HEMT 342 is lowered, effectively increasing the gate-to-source voltage applied the second GaN-HEMT 342 and causing the second GaN-HEMT 342 to turn ON. With the second GaN-HEMT 342 turned ON, the drain voltage VG− of the second GaN-HEMT 342 is pulled down to voltage $V_3$. FIGS. 5A and 5B are signal diagrams showing the voltage levels and timing characteristics of the resulting first and second gate control signals VG+ and VG− produced by the driver control circuit 304. As can be seen, the first gate control signal VG+ varies between an upper voltage level $V_1$ and a lower voltage level $V_3$, and the second gate control signal VG− various between an upper voltage level $V_2$ and a lower voltage level $V_3$.

The driver circuit 306 comprises a push-pull type structure having first and second GaN-HEMTs 350 and 352. The first GaN-HEMT 350 is stacked over the second GaN-HEMT 352 in a totem-pole-like configuration, with the source of the first GaN-HEMT 350 connected to the drain of the second GaN-HEMT 352. The drain of the first GaN-HEMT 350 is configured to connect to a driver power supply $V_{DRV}$, and the source of the second GaN-HEMT 352 is configured to connect to a source power supply that produces a negative supply voltage $V_4$ less than the GaN-HEMT pinch-off voltage $V_P$. (In one embodiment of the invention, $V_4=V_2=-4V$.) The gate of the first GaN-HEMT 350 is configured to receive the first gate control signal VG+ while the second GaN-HEMT 352 is configured to receive the second gate control signal VG−. As illustrated in FIGS. 5A and 5B, the first and second gate control signals VG+ and VG− both have generally square-wave-like waveforms and are preferably 180 degrees out of phase so that ideally only one of the first and second GaN-HEMTs 350 and 352 of the driver circuit 306 conducts at any given time. Permitting only one of the first and second GaN-HEMTs 350 and 352 to conduct at any given time is beneficial since it prevents a waste current path from forming through the first and second GaN-HEMTs 350 and 352.

The purpose of the driver circuit 306 is to generate a drive signal VG for the main power switch (GaN-HEMT 354) of the switch-mode RFPA 308. The drive signal VG produced by the driver circuit 306 has a generally square-wave-like waveform with fast edge transitions and limited and controlled high and low magnitude levels. Preferably, the drive signal VG is directly connected to the input of the switch-mode RFPA 308, i.e., is not coupled to the input of the switch-mode RFPA 308 via an AC coupling capacitor. Directly connecting the drive signal VG to the input of the switch-mode RFPA 308 ensures that the waveform of the drive signal VG remains substantially square-wave like and is not slowed or distorted by the presence of an AC coupling capacitor. Directly connecting the drive signal VG to the input of the switch-mode RFPA 308 also avoids the need for any additional components and/or power supplies that would be needed to bias the input of the switch-mode RFPA 308 if AC coupling was to be used, since biasing can be established and set by the driver circuit 306 and appropriate selection of the driver circuit 306 power supplies.

Figure 5C:
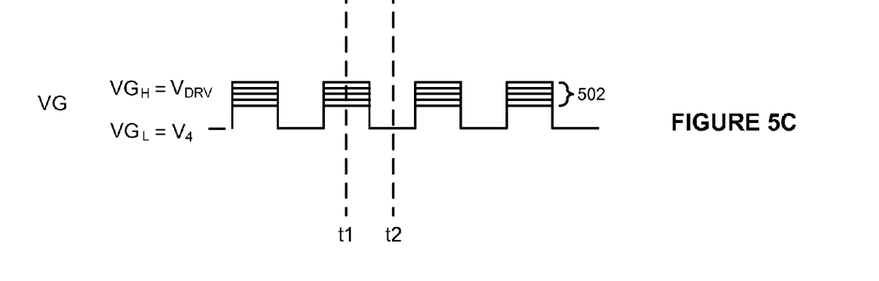
FIG. 5C is a signal diagram of the drive signal generated by the driver circuit of the RFPA driver apparatus in FIG. 3.

The drive signal VG switches the main power GaN-HEMT 354 of the switch-mode RFPA 308 ON and OFF as follows. During times when the first GaN-HEMT 350 of the driver circuit 306 is ON and the second GaN-HEMT 352 is OFF, such as, for example, during time t=t1 (see FIGS. 5A and 5B), a voltage VG+=$V_1$ is applied to the gate of the first GaN-HEMT 350 while a voltage VG−=$V_3$ is applied to the gate of the second GaN-HEMT 352. The voltage VG+=$V_1$ has a value sufficient to maintain a conducting channel between the drain and source of the first GaN-HEMT 350, and the voltage VG−=$V_3$ has a value sufficiently negative to pinch off the conducting channel in the second GaN-HEMT 352. Thus charge flows through the GaN-HEMT 350 into the gate of the main power GaN-HEMT 354 of the RFPA 308 to turn the main power GaN-HEMT 354 ON. With the second GaN-HEMT 352 OFF and the first GaN-HEMT 350 ON, the gate voltage VG applied to the gate of the main power GaN-HEMT 354 is pulled up to level of the driver supply voltage $V_{DRV}$. Conversely, during times when the first GaN-HEMT 350 is OFF and the second GaN-HEMT 352 is ON, such as, for example, during time t=t2, a voltage VG+=$V_3$ is applied to the gate of the first GaN-HEMT 350 while a voltage VG−=$V_2$ is applied to the gate of the second GaN-HEMT 352. The voltage VG−=$V_2$ has a value sufficient to maintain a conducting channel between the drain and source in the second GaN-HEMT 352, and the voltage VG+=$V_3$ is sufficiently negative to pinch off the conducting channel in the first GaN-HEMT 350. With the first GaN-HEMT 350 OFF and the second GaN-HEMT 352 ON, the gate voltage VG applied to the gate of the main power GaN-HEMT 354 is pulled down to voltage level $V_4$ sufficient to pinch off its conducting channel and turn it OFF FIG. 5C is a signal diagram showing the voltage levels and timing characteristics of the resulting drive signal VG produced by the driver circuit 306. The drive signal VG has very fast rising and falling transitions and its high and low drive levels $VG_H$ and $VG_L$ are limited and controlled. Specifically, the low drive level $VG_L$ is limited to $VG_L=V_4$ (in one embodiment just below the main power GaN-HEMT 354 pinch-off voltage $V_P$) and the high drive level $VG_H$ is limited to the driver circuit supply voltage, i.e., $VG_H=V_{DRV}$. Note that in one embodiment of the invention, the high drive level $VG_H$ is adjustable to one of a plurality of different high drive levels, as indicated by the bracket 502 in FIG. 5C. Since $VG_H=V_{DRV}$, this adjustment can be made by simply varying the driver supply voltage $V_{DR}v$. (In one embodiment of the invention in which the pinch-off voltage of the main power GaN-HEMT 354 is $V_P=-3.8V$, the high drive level $VG_H$ is adjustable to one of 0V, −1V or −2V.) This variable-drive capability is beneficial since it allows the high drive level $VG_H$ to be reduced during times the switch-mode RFPA 308 is transmitting only at low output power levels. Lowering the high drive level $VG_H$ at low output power levels reduces gate leakage and undesirable amplitude-dependent phase distortion (i.e., AM-PM distortion), thereby improving the output dynamic range of the RFPA 308.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

What is claimed is:

1. A monolithic microwave integrated circuit (MIMIC) for driving a switch-mode radio frequency power amplifier (RFPA), comprising:
 a driver control circuit configured to generate first and second driver controls signals;
 an input signal conditioning circuit coupled to said driver control circuit configured to generate a conditioned input RF signal for said driver control circuit from an unconditioned input RF signal, said conditioned input RF signal having shorter-duration high-to-low and low-to-high transitions times than the unconditioned input RF signal;
 a first field effect transistor (FET) having a gate configured to receive the first driver control signal, a drain configured to be coupled to a first power supply, and a source; and
 a second FET having a gate configured to receive the second driver control signal, a drain coupled to the source of said first FET, and a source configured to be coupled to a second power supply,
 wherein said first and second FETs are configured to generate a switch-mode RFPA drive signal having a generally square-wave-like waveform and are configured to limit and control the upper and lower magnitude levels of the switch-mode RFPA drive signal to levels that allow a switch-mode RFPA to be driven by said switch-mode RFPA drive signal without DC input biasing applied to the input of the switch-mode RFPA.

2. The MMIC of claim 1, wherein said first and second FETs are first and second gallium-nitride high electron-mobility transistors (GaN-HEMTs).

3. The MMIC of claim 1, wherein said driver control circuit comprises a differential pair.

4. The MMIC of claim 3, wherein said differential pair comprises an unbalanced differential pair.

5. The MMIC of claim 1, wherein said input signal conditioning circuit comprises a differential pair.

6. The MIMIC of claim 1, wherein the drain of said first FET is configured to be coupled to a first power supply that produces a variable supply voltage and said first FET is configured to limit the upper magnitude level of the switch-mode RFPA drive signal depending on a value of the supply voltage produced by said first power supply.

7. A monolithic microwave integrated circuit (MIMIC), comprising:
 a switch-mode radio frequency power amplifier (RFPA) driver comprising first and second field-effect transistors (FETs) arranged in a totem-pole-like configuration, said switch-mode RFPA driver configured to generate a switch-mode RFPA drive signal having a generally square-wave-like waveform for driving a switch-mode RFPA; and
 an RF driver control circuit coupled to said switch-mode RFPA driver comprising third and fourth FETs arranged in an unbalanced differential pair, said RF driver control circuit configured to generate first and second control signals for controlling the first and second FETs of said switch-mode RFPA driver;
 an input RF signal conditioning circuit coupled to said RF driver control circuit including fifth and sixth FETs arranged in a second differential pair, said input RF signal conditioning circuit configured to generate a single-ended or differential conditioned input RF signal for said RF driver control circuit from an unconditioned input RF signal, said conditioned input RF signal having shorter-duration high-to-low and low-to-high transitions times than the unconditioned input RF signal.

8. The MMIC of claim 7, wherein the first and second FETs of said switch-mode RFPA driver and the third and fourth FETs of said RF driver control circuit are gallium nitride high electron-mobility transistors (GaN-HEMTs).

9. The MIMIC of claim 7, wherein said switch-mode RFPA driver is configured to limit an upper magnitude level of the switch-mode RFPA drive signal to a value dependent upon an RF output power level of a switch-mode RFPA that said RFPA driver is configured to drive.

10. The MMIC of claim 7, wherein the first and second FETs of said switch-mode RFPA driver are configured to limit and control upper and lower magnitude levels of the switch-mode RFPA drive signal to levels that allow the switch-mode RFPA driver to directly drive a switch-mode RFPA without DC input biasing applied to the input of the switch-mode RFPA.

11. The MMIC of claim 7, further comprising a switch-mode RFPA configured to be driven by the switch-mode RFPA drive signal generated by said switch-mode RFPA driver.

12. The MMIC of claim 11, wherein the switch-mode RFPA drive signal generated by said switch-mode RFPA driver is directly connected to an input of said switch-mode RFPA and the first and second FETs of said switch-mode RFPA driver are configured to limit and control the upper and lower magnitude levels of the switch-mode RFPA drive signal to levels that allow said switch-mode RFPA driver to drive said switch-mode RFPA without DC input biasing applied to the input of said switch-mode RFPA.

13. The MMIC of claim 11, wherein the first and second FETs of said switch-mode RFPA driver, the third and fourth FETs of said RF driver control circuit, and one or more power FETs of said switch-mode RFPA are gallium nitride high electron-mobility transistors (GaN-HEMTs).

14. The MMIC of claim 7, wherein the first and second FETs of said switch-mode RFPA driver, the third and fourth FETs of said RF driver control circuit, and the fifth and sixth FETs of said input RF signal conditioning circuit are gallium nitride high electron-mobility transistors (GaN-HEMTs).

* * * * *